(12) United States Patent
Kim et al.

(10) Patent No.: US 7,042,072 B1
(45) Date of Patent: May 9, 2006

(54) SEMICONDUCTOR PACKAGE AND METHOD OF MANUFACTURING THE SAME WHICH REDUCES WARPAGE

(75) Inventors: Young Ho Kim, Seoul (KR); Seok Hyun Choi, Seoul (KR); Choon Heung Lee, Seoul (KR); Sung Su Park, Seoul (KR); Sung Soon Park, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 19 days.

(21) Appl. No.: 10/212,496

(22) Filed: Aug. 2, 2002

(51) Int. Cl.
*H01L 23/02* (2006.01)
*H01L 21/44* (2006.01)

(52) U.S. Cl. ............... 257/678; 257/668; 257/684; 257/701; 438/107; 438/108

(58) Field of Classification Search ......... 257/730, 257/734, 735, 738, 783, 668, 678, 684, 701, 257/713, 737, 778–780; 438/64, 68, 118, 438/460, 462, 464, 107, 108, 111, 123
See application file for complete search history.

(56) References Cited

U.S. PATENT DOCUMENTS

| | | | |
|---|---|---|---|
| 4,722,130 A * | 2/1988 | Kimura et al. ............ 29/413 |
| 5,347,429 A | 9/1994 | Kohno et al. |
| 5,463,253 A | 10/1995 | Waki et al. |
| 5,474,957 A | 12/1995 | Urushima |
| 5,474,958 A | 12/1995 | Djennas et al. |
| 5,581,498 A | 12/1996 | Ludwig et al. |
| 5,674,785 A | 10/1997 | Akram et al. |
| 5,739,581 A | 4/1998 | Chillara et al. |
| 5,739,585 A | 4/1998 | Akram et al. |
| 5,798,014 A | 8/1998 | Weber |
| 5,835,355 A | 11/1998 | Dordi |
| 5,894,108 A | 4/1999 | Mostafazadeh et al. |
| 5,903,052 A | 5/1999 | Chen et al. |
| 5,952,611 A | 9/1999 | Eng et al. |
| 6,013,948 A | 1/2000 | Akram et al. |
| 6,034,427 A | 3/2000 | Lan et al. |
| 6,060,778 A | 5/2000 | Jeong et al. |
| 6,072,243 A | 6/2000 | Nakanishi |
| 6,100,804 A * | 8/2000 | Brady et al. ............ 340/572.7 |
| 6,122,171 A | 9/2000 | Akram et al. |
| 6,127,833 A | 10/2000 | Wu et al. |
| 6,160,705 A | 12/2000 | Stearns et al. |

(Continued)

FOREIGN PATENT DOCUMENTS

JP 05136323 A 1/1993

(Continued)

*Primary Examiner*—Donghee Kang
(74) *Attorney, Agent, or Firm*—Weiss, Moy & Harris, P.C.

(57) ABSTRACT

A semiconductor package and method of producing the same has a semiconductor die having a first face and a second face. A coating material is coupled to the second face of the semiconductor die. A substrate having a cavity is provided wherein the semiconductor die is placed within the cavity. An encapsulant is used to encapsulate the second face of the semiconductor die placed in the cavity. Connection members are provided to couple the semiconductor die and the substrate in order to transfer signals between the semiconductor die and the substrate. Terminal members are couple to the substrate to connect the semiconductor package to an external device. In the semiconductor package, a thermal expansion coefficient of the coating material C and a thermal expansion coefficient of the encapsulant E should be approximately equal in value in order to limit the problems associated with warpage.

16 Claims, 7 Drawing Sheets

U.S. PATENT DOCUMENTS

| | | | |
|---|---|---|---|
| 6,172,419 B1 * | 1/2001 | Kinsman | 257/737 |
| 6,184,463 B1 | 2/2001 | Panchou et al. | |
| 6,214,641 B1 | 4/2001 | Akram | |
| 6,225,703 B1 * | 5/2001 | Umehara et al. | 257/787 |
| 6,235,554 B1 | 5/2001 | Akram et al. | |
| 6,294,831 B1 * | 9/2001 | Shishido et al. | 257/729 |
| 6,361,959 B1 * | 3/2002 | Beroz et al. | 435/14 |
| 6,395,578 B1 | 5/2002 | Shin et al. | |
| 6,555,924 B1 * | 4/2003 | Chai et al. | 257/788 |
| 6,558,975 B1 * | 5/2003 | Sugino et al. | 438/64 |
| 6,656,819 B1 * | 12/2003 | Sugino et al. | 438/460 |
| 6,790,710 B1 * | 9/2004 | McLellan et al. | 438/122 |
| 2002/0180024 A1 * | 12/2002 | Huang et al. | 257/687 |
| 2003/0218237 A1 * | 11/2003 | Hall et al. | 257/675 |

FOREIGN PATENT DOCUMENTS

| | | |
|---|---|---|
| JP | 05109975 A | 3/1993 |
| JP | 10-173085 | 6/1998 |

\* cited by examiner

SEMICONDUCTOR PACKAGE AND METHOD OF MANUFACTURING THE SAME WHICH REDUCES WARPAGE

FIELD OF THE INVENTION

This invention relates to semiconductor devices and, more specifically, to a semiconductor package and method of manufacturing the same which reduces warpage during the cool down phase of the manufacturing process.

BACKGROUND OF THE INVENTION

In general, a semiconductor package is fabricated using a substrate such as lead frame, printed circuit board, circuit film, circuit tape, or the like. A semiconductor die is coupled to the substrate and packaged to be airtight to protected the semiconductor die from the outer environment as well as to enable the semiconductor package to be electrically connected to external devices.

Namely, each semiconductor package has the structure enabling the semiconductor package to protect the semiconductor die as well as to be mounted on an external device, for example a mother board, or the like. In order to complete such a structure, processes of various steps are required.

Generally speaking, there is Post Mold Cure (PMC) or reflow requiring thermal treatment in the processes of the various steps. On carrying out the PMC or reflow, a process temperature is increased up to a predetermined temperature, and then gradually decreased down to a room temperature.

In a general semiconductor package fabricating method, a face on which an integrated circuit of a semiconductor die is formed should be encapsulated with an encapsulant. In the PMC or reflow process, when the semiconductor package is cooled down after heating, a warpage occurs in the semiconductor package due to a heat expansion coefficient difference between the semiconductor die and the encapsulant.

Namely, the semiconductor die and the encapsulant have different coefficients of thermal expansion (CTE). The difference in the coefficients of thermal expansion brings about a warpage due to the difference of shrinkage on cooling-down.

Unfortunately, the warpage of the semiconductor package causes the following problems or disadvantages. A total height of the semiconductor package increases. Accordingly, a height of the semiconductor package may increases anywhere from 10 to 20% more than its original height due to warpage. Thus, a thin semiconductor package is no more. Moreover, when the semiconductor package having the warpage is mounted on an external device, it is difficult to mount the semiconductor package on the external device properly.

Therefore, a need existed to provide a device and method to overcome the above problem.

SUMMARY OF THE INVENTION

A semiconductor package and method of producing the same has a semiconductor die having a first face and a second face. A coating material is coupled to the second face of the semiconductor die. A substrate having a cavity is provided wherein the semiconductor die is placed within the cavity. An encapsulant is used to encapsulate the second face of the semiconductor die placed in the cavity. Connection members are provided to couple the semiconductor die and the substrate in order to transfer signals between the semiconductor die and the substrate. Terminal members are couple to the substrate to connect the semiconductor package to an external device. In the semiconductor package, a thermal expansion coefficient of the coating material C and a thermal expansion coefficient of the encapsulant E should be approximately equal in value in order to limit the problems associated with warpage.

The present invention is best understood by reference to the following detailed description when read in conjunction with the accompanying drawings.

BRIEF DESCRIPTION OF THE DRAWINGS

Common reference numerals are used throughout the drawings and detailed descriptions to indicate like elements.

DETAILED DESCRIPTION

Figure 1:
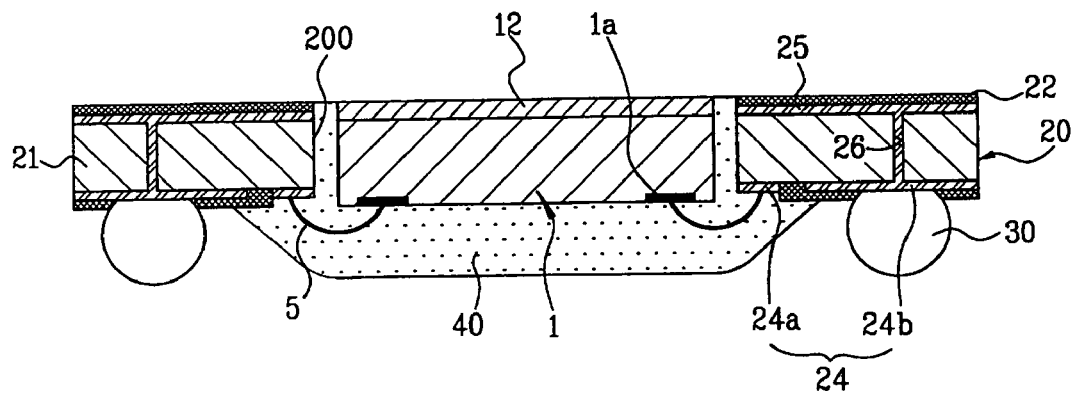
FIG. 1 is a cross-sectional view of one embodiment of a semiconductor package according to the present invention.

Referring to FIG. 1, a cross-sectional view of one embodiment of a semiconductor package according to the present invention is illustrated.

As shown in FIG. 1, a semiconductor package includes a semiconductor die 1. On a surface opposite to a integrated circuit forming face is a coating material 12. A cavity 200 is formed in a substrate 20. The cavity 200 is where the semiconductor die 1 is placed. An encapsulant 40 is used to encapsulate the integrated circuit forming face of the semiconductor die 1 lying in the cavity 200. Electrically conductive wire 5 are used to connect electrically the semiconductor die 1 to the substrate 20 for signal transfer between the semiconductor die 1 and substrate 20.

The semiconductor die 1 has bond pads 1a located so as to leave a predetermined interval from an inner face of the cavity 200 in the substrate 20.

There are various forms for the substrate 20 used for the semiconductor package. The substrate 20 may be printed circuit board, circuit film, circuit tape, or the like. The materials for the substrate 20 are not specially restricted. The substrate 20 is generally constructed with at least two layers of electrical conductive patterns between which an insulating layer 21 is inserted. In the drawing, the double-layered electrical patterns 24 and 25 are shown exemplary. The electrical conductive patterns 24 and 25 are electrically connected to each other through via holes 26. In the electrical conductive patterns 24 and 25, most areas of the electrical conductive patterns 24 formed at the attaching face of conductive balls of the substrate 20 are covered with a solder resist 22. Yet, some areas are exposed in part for input/output of electric signals. The exposed areas include areas of bond fingers 24a and ball lands 24b. Meanwhile, the rest of the area of the electrical conductive patterns 24 and 25 formed on the surface of the substrate 20, except the areas of the bond fingers 24a and ball lands 24b, is covered with the resist 22, thereby enabling to protect the electrical conductive patterns 24 and 25 as well as prevent the respective patterns from electrical short.

The semiconductor package according to the present invention, as shown in the drawing, uses electrically conductive wire 5 as contact means between the semiconductor die 1 and substrate 20. The electrically conductive wire 5 is used for exchanging electric signals between the semiconductor die 1 and substrate 20. One end of the electrically conductive wire 5 is bonded to bond pads 1a of the semiconductor die 1. The other end of the electrically conductive wire 5 is bonded to bond fingers 24a of the substrate 20. The electrically conductive wire 5 is made of a metal material having electro-conductivity such as one of Au, Al, Cu, and the like. It should be noted that the present invention is not limited to this scope of the metal materials.

Moreover, the ball lands 24b, which are the exposed areas of the electrical conductive patterns of the substrate 20, play a role in exchanging electrical signals inside the semiconductor package with an external device.

The conductive balls 30, as shown in the drawing, are attached to the ball lands 24b, respectively. The conductive balls 30 are made from a conductive metal material. The conductive balls 30 are generally solder balls. The conductive balls 30 may be made from electro-conductive materials such as Au, Cu, Al, and the like. It should be noted that the listing of the electro-conductive materials should not be seen as to limit the scope of the present invention. The conductive balls 30 are attached to the external device by welding when the completed semiconductor package is mounted on the external device or the like, thereby functioning as media connecting the semiconductor package and external device reciprocally.

The integrated circuit formed face of the semiconductor die 1 and the electrically conductive wires 5 are protected by the encapsulant 40. The encapsulant 40 is mainly made of non-conductive paste or film, which is coated on the integrated circuit formed face of the semiconductor die 1 and then hardened by PMC. Besides, the method of fabricating the semiconductor package requires processes of thermal treatment such as reflow and the like as well as PMC. When the thermal treatment processes are carried out, the components of the semiconductor package have different CTE so as to differ in shrinkage as well as the degree of expansion.

The coating material 12 coated on the face opposite to the integrated circuit formed face of the semiconductor die 1 is made of a material of which the CTE is equal or similar to that of the encapsulant 40. For instance, the coating material 12 can use the same material of the encapsulant 40 as well as an epoxy based resin. Moreover, if the CTE of the coating material 12 is C and the other CTE of the encapsulant 40 is E, a ratio C/E satisfies preferably the relation of $0.5 \leq C/E \leq 2$. For instance, when EMC (epoxy mold compound) is used for the encapsulant 40, a CTE of EMC is about 26.2 ppm. Therefore, a material satisfying the relation of $0.5 \leq C/E \leq 2$ is selected for the coating material 12.

Figure 2:
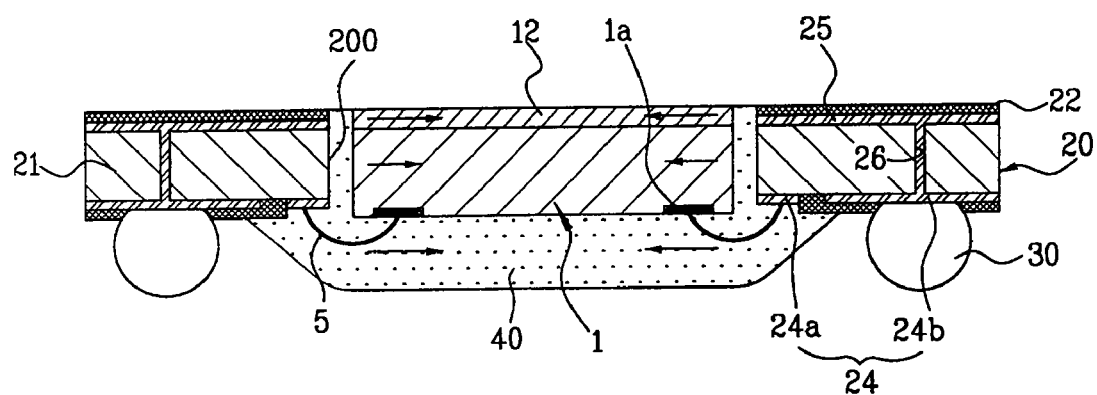
FIG. 2 is a cross-sectional view of the semiconductor package according to one embodiment of the present invention for explaining a shrinkage difference using arrows when encapsulant, semiconductor die, and coating material are shrunk after a thermal expansion.

Referring to FIG. 2, a cross-sectional view of the semiconductor package according to one embodiment of the present invention is illustrated. FIG. 2 explains a shrinkage difference using arrows when encapsulant 40, semiconductor die 1, and coating material 12 are shrunk after heat expansion.

As shown in FIG. 2, lengths of the arrows indicate the sizes of the shrinkage forces when the coating material 12, semiconductor die 1, and encapsulant 40 are shrunk after thermal expansion.

Being relatively lower than CTE of the coating material 12 or encapsulant 40, the semiconductor die 1 has the degree of shrinkage smaller than that of the coating material 12 or encapsulant 40 when being cooled after thermal expansion.

The coating material 12 and encapsulant 40 wrapping both faces of the semiconductor die 1 have CTEs bigger than that of the semiconductor die 1 so as to have the shrinkage size bigger than that of the semiconductor die 1 as well.

In this case, the coating material 12 and encapsulant 40 wrapping the two faces of the semiconductor die 1 have the CTE which are almost identical to each other so as to have the similar shrinkage forces. Thus, the shrinkage forces of the coating material 12 and encapsulant 40 cancelled each other so as to meet the reciprocal balance. Therefore, there occurs little to no warpage of the semiconductor package.

Namely, as explained in the above description of the present invention, materials having the same or similar CTE are laid on both faces of the semiconductor die 1 so as to make the shrinkage quantity similar or identical on the cooling step of the thermal treatment process such as PMC or the like. Thus, the warpage of the semiconductor package is prevented, thereby enabling the semiconductor package to maintain the original designed height. Moreover, being made of the metal material having excellent property of thermal-conductivity, the coating material 12 plays a role in helping heat dissipation of the semiconductor die 1 as a heat sink.

Moreover, when the semiconductor die 1 is detached individually from the wafer in order to attach the semiconductor die 1 to the substrate 20 after sawing the thin wafer, an ejector pin (not shown in the drawing) pushes the coating material 12 instead of the semiconductor die 1 so as to prevent the damage on the semiconductor die 1. Namely, the coating material 12 prevents die scratch or die crack which may be caused by a direct contact between the ejector pin and semiconductor die 1.

Figure 3:
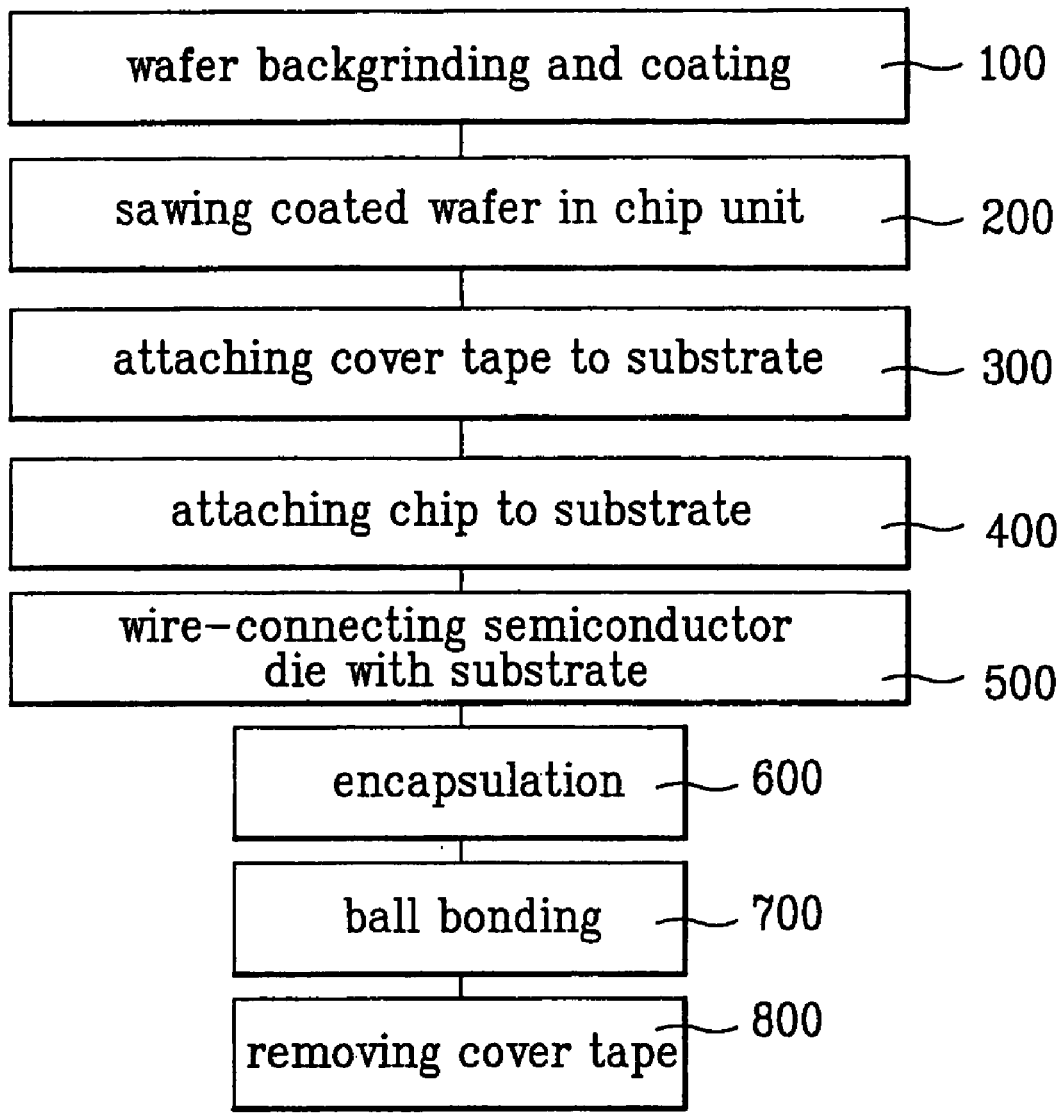
FIG. 3 is a flowchart of a method of fabricating one embodiment of a semiconductor package according to the present invention.

Referring to FIG. 3, a flowchart of a method of fabricating a semiconductor package according to the present invention is illustrated.

Referring to FIG. 3, in a first step 100, back-grinding is carried out on the face opposite to the integrated circuit formed face of the wafer 10. The back-grinded face is then coated with the coating material 12.

Since the coating material 12 makes the handling of the wafer 10 easier, the wafer 10 is preferably back-grinded thinner than the related art.

In a second step 200, sawing is carried out on the coated wafer 10 so as to divide the coated wafer 10 into units of individual semiconductor dies 1.

In a third step 300, a cover tape 60 is attached to a backside of the substrate 20 having the cavity 200 at a center thereof into which the semiconductor die 1 is inserted.

In a fourth step 400, the sawed semiconductor die 1 is attached to the substrate 20 having the cavity 200.

In a fifth step 500, the semiconductor die 1 is electrically connected to the substrate 20. The electrical connection is preferably achieved using conductive wires or bumps.

In a sixth step 600, the integrated circuit formed area of the semiconductor die 1 and the areas of the bond fingers 24a of the substrate 20 are encapsulated with the encapsulant 40.

In a seventh step 700, the conductive balls 30 are attached to the ball lands 24b of the substrate 20, respectively.

In an eighth step 800, the cover tape 60 attached to the backside of the substrate 20 is removed so as to complete the package.

Thereafter, a process of marking on the coating material 12 may be carried out in addition.

Referring to FIG. 4A to FIG. 4H, views of a method of fabricating one embodiment of a semiconductor package according to the present invention are illustrated.

Figure 4A:
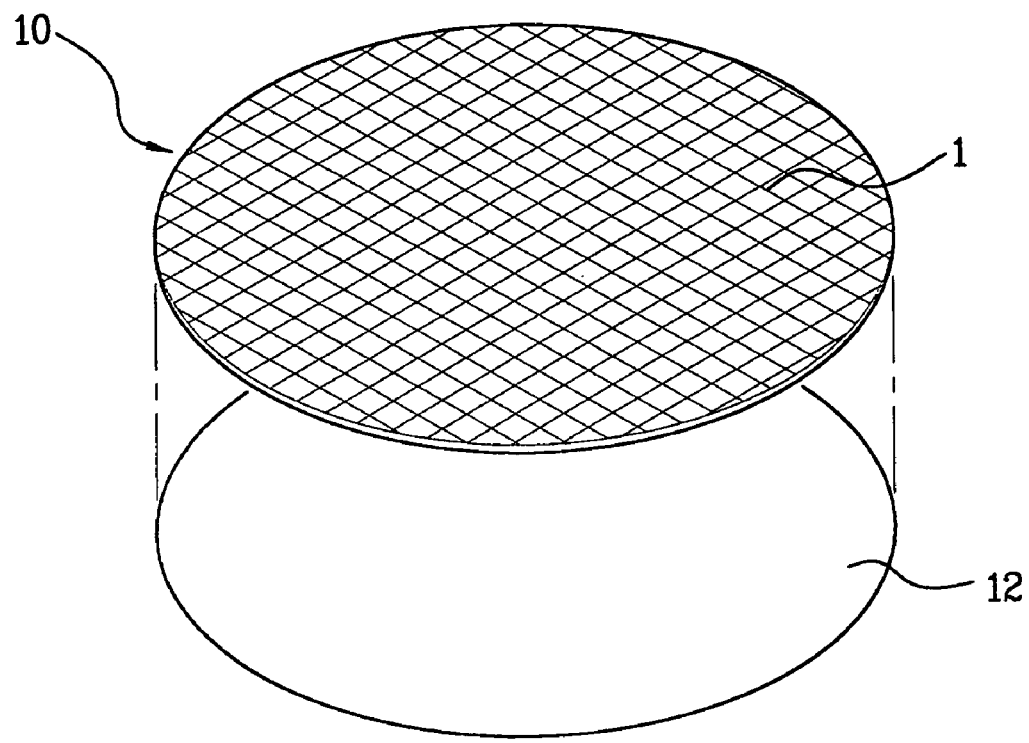
FIG. 4A to FIG. 4H depicts a method of fabricating one embodiment of a semiconductor package according to the present invention.

As shown in FIG. 4A, the wafer 10 is through the back-grinding process. And, illustrated schematically is a state that the coating material 12 is being coated on the back-grinded face. For reference, in order to fabricate the semiconductor die 1, integrated circuit is firstly formed through a fabrication process on the round wafer 20 made of $SiO_2$ crystals.

The wafer 10 maintains a predetermined thickness when the integrated circuit is formed. The predetermined thickness should be minimized so as to be applied to the respective products, for which grinding is carried out on the face of the wafer 10 opposite to the integrated circuit formed face.

The coating material 12 is preferably coated using spin coating, which is not limited in the present invention. One of stencil coating, sputtering, tape attach, plating, and the like can be selectively applied thereto. For the selection of the coating material 12, a physical property of the encapsulant 40 should be considered. As mentioned in the foregoing description, if the CTE of the coating material 12 is C and the other CTE of the encapsulant 40 is E, a ratio C/E satisfies preferably the relation of $0.5 \leq C/E \leq 2$.

Figure 4B:
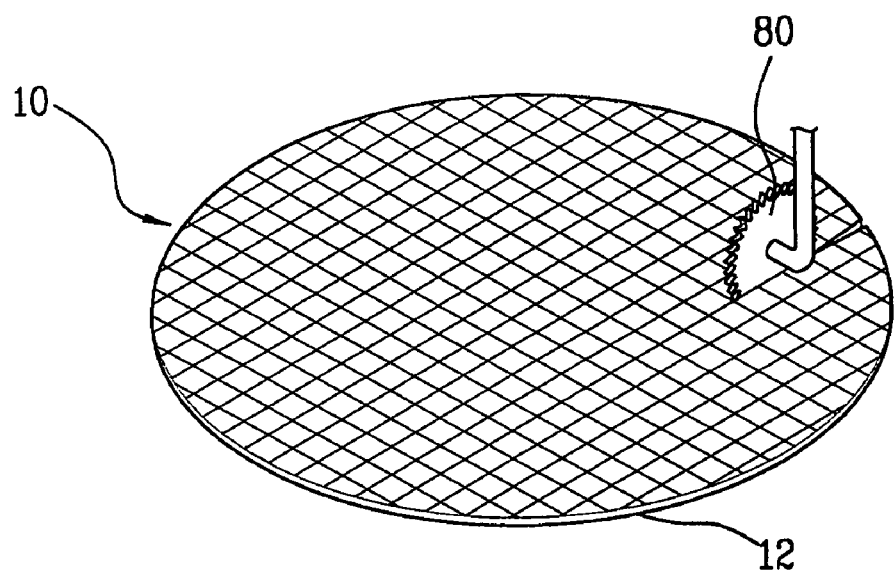

As shown in FIG. 4B, the wafer 10 in FIG. 4A is sawed so as to divide the semiconductor dies into individual units.

Scribing lines are already formed on the wafer 10. In a sawing process, a rotating saw wheel 80 is moved along the scribing lines so that blades of the saw wheel 80 divide the respective semiconductor dies 1 of the wafer 10 into the individual units.

The integrated circuit is formed at one face of the semiconductor die 1 divided into each individual unit, and the coating material 12 is formed at the other face.

Figure 4C:
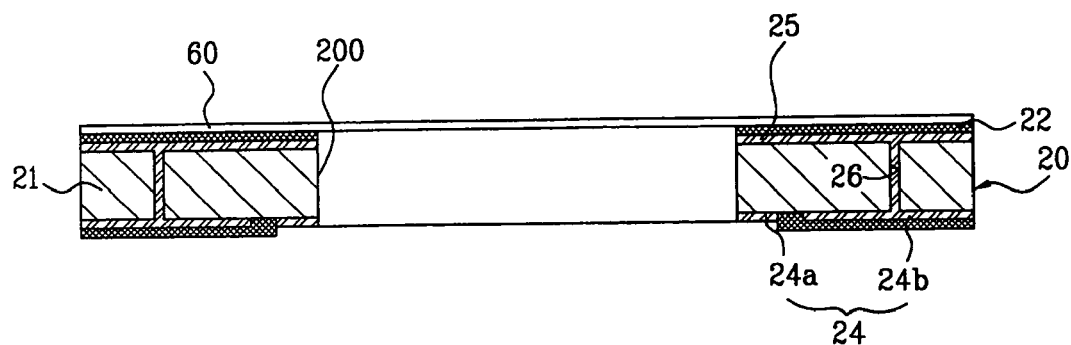

As shown in FIG. 4C, the cover tape 60 is attached to the backside of the substrate 20. The cavity 200 at the central part of the substrate 20 provides a space in which the semiconductor die 1 is inserted, and the cover tape 60 provides an attachment face for the semiconductor die 1.

Figure 4D:
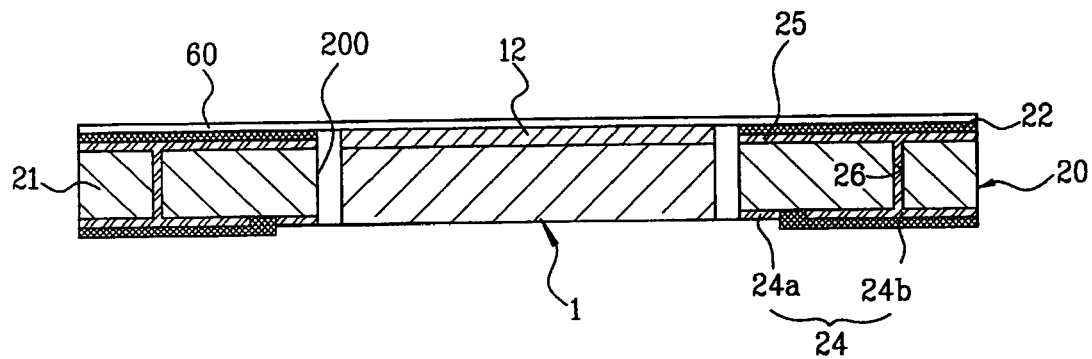

As shown in FIG. 4D, the semiconductor die 1 is attached to the substrate 20. The semiconductor die 1 fabricated through the first and second steps is inserted in the cavity 200 of the substrate 20, to which the cover tape 60 is attached in the third step, so as to be attached to the cover tape 60.

Figure 4E:
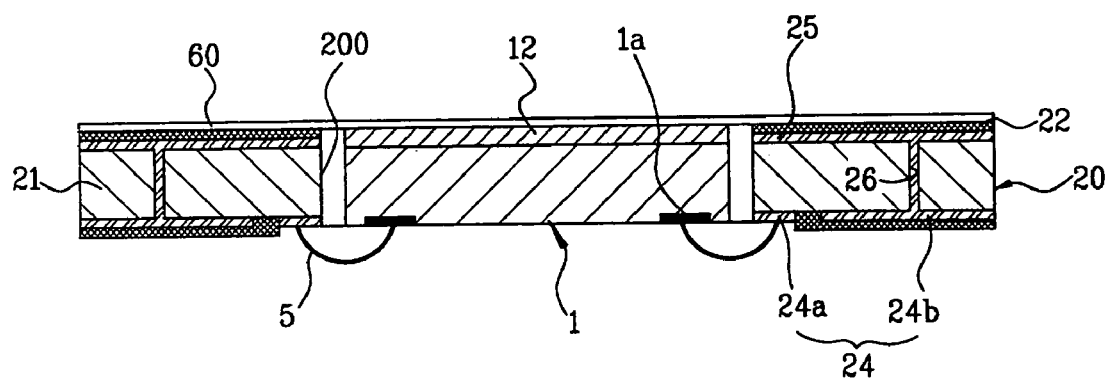

As shown in FIG. 4E, the bond pads 1a of the semiconductor die 1 and the bond fingers 24a of the substrate 20 are connected each other through the conductive wires 5.

Figure 4F:
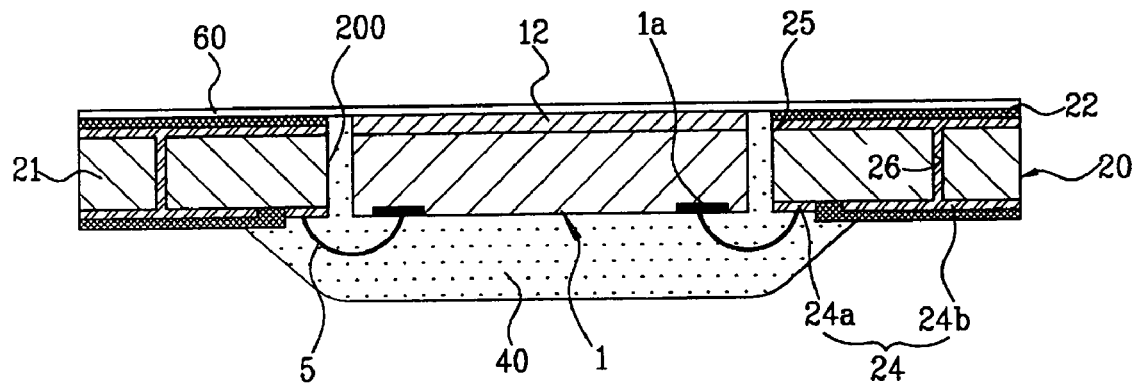

As shown in FIG. 4F, encapsulated are the integrated circuit formed area of the semiconductor die 1 and the areas of the bond fingers 24a of the substrate 20 at which the conductive wires 5 are installed.

The encapsulant 40, as mentioned already, is preferably made of a material of which the CTE is similar to that of the coating material of the semiconductor die 1 within a 10% error limit.

Figure 4G:
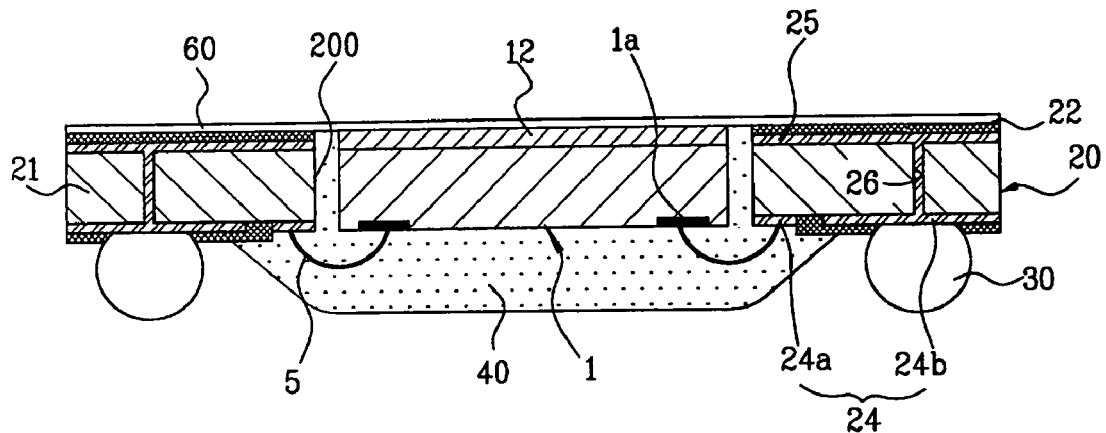

As shown in FIG. 4G, the conductive balls 30 are attached to the ball lands 24a of the substrate 20, respectively.

Figure 4H:
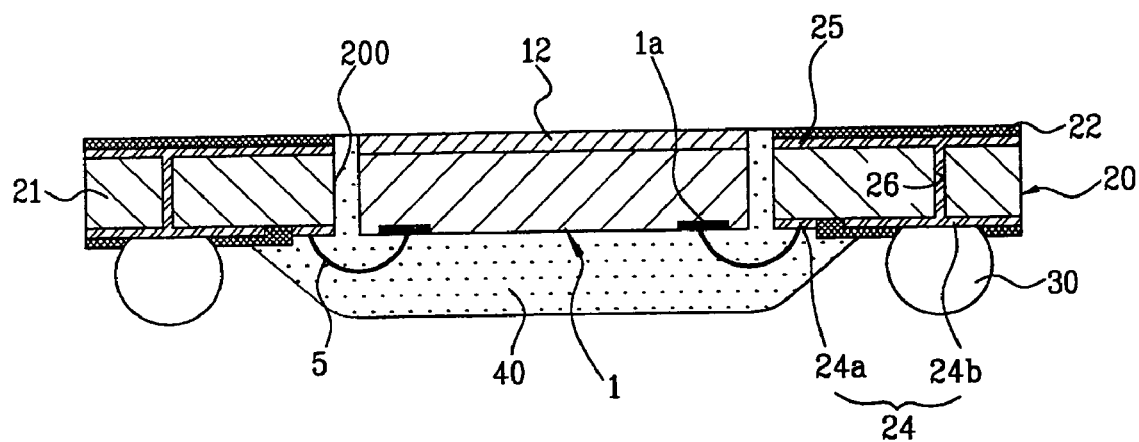

As shown in FIG. 4H, the cover tape 60 attached to the backside of the substrate 20 is removed so as to complete the semiconductor package according to the present invention.

Thereafter, after the cover tape 60 has been removed, a process (not shown in the drawing) of marking product information on a surface of the coating material 12 using ink or laser may be carried out in addition.

Figure 5:
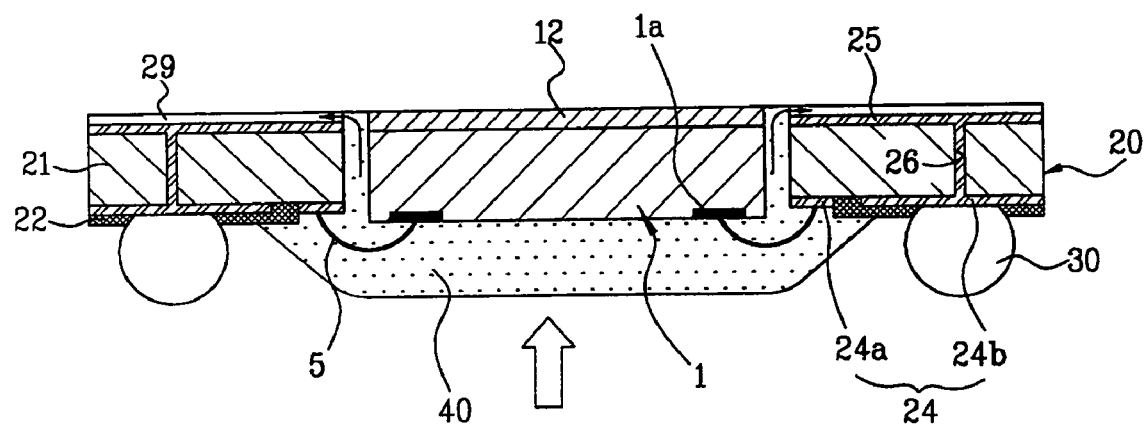
FIG. 5 is a cross-sectional view of another embodiment of a semiconductor package according to the present invention.
Figure 6:
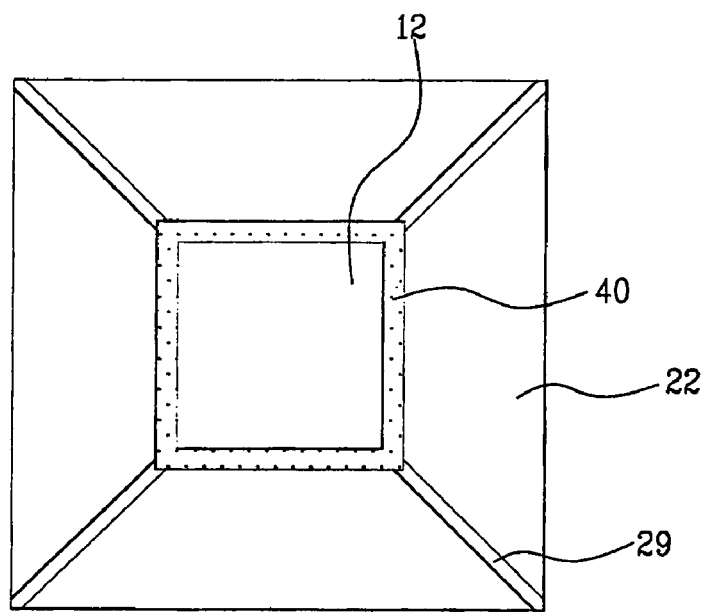
FIG. 6 is top plan view of FIG. 5, in which air vents are formed on a surface of a substrate.

Referring to FIG. 5 and FIG. 6, a cross-sectional view of a semiconductor package according to another embodiment of the present invention and a layout in which air vents are formed on a surface of a substrate are illustrated respectively.

As shown in FIG. 5 and FIG. 6, another embodiment of the present invention is shown. This embodiment is similar to the previous embodiment in aspect of using the semiconductor die 1 coated with a coating material of which heat expansion coefficient is similar to that of the encapsulant 40. However, this embodiment is different from the previous embodiment in that air vents 29 are formed additionally at a surface of the substrate 20. The air vents 29, as shown in the FIG. 6, are formed by removing portions of the solder resist 22 coated on the backside of the substrate 20 like slots.

Arrows in FIG. 5 indicate a flow path of the encapsulant 40 in an encapsulating process. Namely, while the semiconductor die 1 wire-bonded to the substrate 20 is placed in a metal mold, the encapsulant 40 is injected in a direction opposite to that of the integrated circuit formed face of the semiconductor die 1 so as to surround a circumference of the semiconductor die 1. Likewise, when encapsulation is carried out, air contained in the encapsulant 40 is discharged outside through air vents 29.

Accordingly, if the air vents 29 are formed at the semiconductor package itself, there is no chance for the encapsulant 40 to penetrate the ball lands 24b. Besides, a flow characteristic of the encapsulant 40 is improved so as to prevent previously poor encapsulation caused by generation of voids and the like.

As shown in FIG. 6, a plurality of air vents 29 are formed on a top of the substrate 20 so as to extend long from a die hole 25 of the substrate 20 to the circumference like slot figures.

Each of the air vents 29 forms the slot figure connecting one corner of the die hole 25 to a closest corner of the substrate 20. In the embodiment of the present invention, four air vents 29 are formed. The number of the air vents 29 is not limited to four, but can be adjusted in accordance with a quantity of encapsulation.

Moreover, when the encapsulating process is carried out using EMC and the like, the air vents 29 are formed at the surface of the substrate 20 so as to provide smooth flow of EMC in the metal mold. Therefore, the present invention enables one to provide uniform encapsulation surface as well as prevent the encapsulant 40 from penetrating the ball lands 24b.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a semiconductor die having a first surface having an integrated circuit formed face and a second surface opposite the first surface, the second surface being coated with a coating material which is exposed, the coating material covering approximately an entire surface area of the second surface of the semiconductor die;

a substrate having an aperture and at least one air vent formed in a surface of thereof, the semiconductor die placed in the aperture;

an encapsulant encapsulating the integrated circuit formed face of the semiconductor die placed in the cavity and sidewalls of the semiconductor die; and electrical connection members coupled to the semiconductor die and substrate for signal transfer between the semiconductor die and substrate.

2. A semiconductor package in accordance with claim 1 wherein the encapsulant covers sidewalls of the coating material.

3. A semiconductor package in accordance with claim 1 wherein the coating material is coplanar to the first surface of the semiconductor die.

4. A semiconductor package in accordance with claim 1 wherein the coating material reduces warpage of the semiconductor package.

5. A semiconductor package in accordance with claim 1 wherein the coating material has a coefficient of thermal expansion which reduces warpage of the semiconductor package.

6. A semiconductor package in accordance with claim 1 wherein the coating material and the encapsulant have similar coefficients of thermal expansion.

7. A semiconductor package comprising:
a semiconductor die having a first face which is an integrated circuit formed face and a second face opposite the first face;
a coating material coupled to the second face of the semiconductor die, the coating material being exposed and covering approximately an entire surface area of the second face of the semiconductor die;
a substrate having a cavity and at least one air vent formed in a surface thereof, the semiconductor die placed in the cavity;
means for encapsulating the first face of the semiconductor die placed in the cavity and sidewalls of the semiconductor die; and
means for coupling the semiconductor die and the substrate for signal transfer between the semiconductor die and the substrate.

8. A semiconductor package in accordance with claim 7 further comprising means coupled to the substrate for connecting the semiconductor package to an external device.

9. A semiconductor package is accordance with claim 8 wherein the means coupled to the substrate comprises conductive balls attached to ball lands of the substrate for connection to an external device.

10. A semiconductor package in accordance with claim 7 wherein the means for coupling the semiconductor die and the substrate comprises:
bond pads formed on the semiconductor die;
bond fingers formed on the substrate; and
conductive wiring coupled to the bond pads and the bond fingers for signal transfer between the semiconductor die and the substrate.

11. A method for manufacturing a semiconductor package comprising:
providing a semiconductor die having a first face which is an integrated circuit formed face and a second face opposite the first face;
applying a coating material to the second face of the semiconductor die, a top surface of the coating material being exposed and covering approximately an entire surface area of the second face of the semiconductor die;
providing a substrate having an aperture in which the semiconductor die is placed;
forming air vents in the substrate by removing a portion of a solder resist coated with the coating material of the semiconductor die;
encapsulating the first face of the semiconductor die placed in the cavity and sidewalls of the semiconductor die;
coupling the semiconductor die to the substrate for signal transfer between the semiconductor die and the substrate; and
providing terminal members coupled to the substrate for connecting the semiconductor package to an external device.

12. The method of claim 11 wherein the conductor die is positioned in the cavity so sidewalls of the semiconductor die are not in contact with the substrate.

13. A method of fabricating a semiconductor package, comprising the steps of:
grinding a backside of a wafer to a predetermined thickness;
applying a coating material on the backside of the wafer;
sawing the wafer into semiconductor dies of individual units;
attaching a cover tape to a backside of a substrate having a cavity at a central part thereof;
forming air vents in the substrate by removing a portion of a solder resist coated with the coating material of the semiconductor die;
inserting one of the sawed semiconductor dies in the cavity of the substrate so as to be attached to the cover tape;
connecting bond pads of the semiconductor die electrically to bond fingers of the substrate, respectively; and
encapsulating an integrated circuit formed face of the semiconductor die with an encapsulant.

14. The method of claim 13 wherein the coating material is coated on the wafer using one of spin coating, stencil printing, sputtering, tape attach, plating, and combinations thereof.

15. The method of claim 13 further comprising providing terminal members coupled to the substrate for connecting the semiconductor package to an external device.

16. The method of claim 15 wherein the terminal members are conductive balls coupled to ball lands of the substrate for connecting the semiconductor package to an external device.

* * * * *